(12) United States Patent
Kawasaki et al.

(10) Patent No.: US 9,741,539 B2
(45) Date of Patent: Aug. 22, 2017

(54) RF POWER DELIVERY REGULATION FOR PROCESSING SUBSTRATES

(71) Applicant: APPLIED MATERIALS, INC., Santa Clara, CA (US)

(72) Inventors: Katsumasa Kawasaki, San Jose, CA (US); Justin Phi, Milpitas, CA (US); Sergio Shoji, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/886,891

(22) Filed: Oct. 19, 2015

(65) Prior Publication Data

US 2017/0098527 A1  Apr. 6, 2017

Related U.S. Application Data

(60) Provisional application No. 62/237,367, filed on Oct. 5, 2015.

(51) Int. Cl.
*H01J 37/32* (2006.01)
*G01R 31/00* (2006.01)

(52) U.S. Cl.
CPC .... *H01J 37/32091* (2013.01); *H01J 37/3244* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 6,472,822 B1 | 10/2002 | Chen et al. |
| 6,566,272 B2 | 5/2003 | Paterson et al. |
| 6,818,562 B2 | 11/2004 | Todorow et al. |
| 6,942,813 B2 | 9/2005 | Ying et al. |
| 7,141,514 B2 | 11/2006 | Chua |
| 7,214,628 B2 | 5/2007 | Chua |
| 7,718,538 B2 | 5/2010 | Kim et al. |
| 7,737,042 B2 | 6/2010 | Kim et al. |
| 7,771,606 B2 | 8/2010 | Kim et al. |

(Continued)

OTHER PUBLICATIONS

U.S. Appl. No. 15/068,999, Mar. 14, 2016, Leray et al.
International Search Report and Written Opinion mailed Oct. 24, 2016 for PCT Application No. PCT/US2016/042951.

*Primary Examiner* — Shamim Ahmed
(74) *Attorney, Agent, or Firm* — Moser Taboada; Alan Taboada

(57) ABSTRACT

Methods of operating a plasma enhanced substrate processing system using pulsed radio frequency (RF) power are provided herein. In some embodiments, a method of operating a plasma enhanced substrate processing system using pulsed radio frequency (RF) power includes providing a first pulsed RF power waveform to a process chamber at a first power level during a first time period, providing a second pulsed RF power waveform at a first power level to the process chamber during the first time period, obtaining a first reflected power created by the first and second pulsed RF power waveforms provided during the first time period, and performing a first load leveling process to adjust the first power level of the first pulsed RF power waveform to compensate for the obtained reflected power during the first time period to produce a delivered power at a preset power level.

15 Claims, 8 Drawing Sheets

(56) References Cited

U.S. PATENT DOCUMENTS

| | | |
|---|---|---|
| 7,967,944 B2 | 6/2011 | Shannon et al. |
| 8,002,945 B2 | 8/2011 | Shannon et al. |
| 8,018,164 B2 | 9/2011 | Shannon et al. |
| 8,264,154 B2 | 9/2012 | Banner et al. |
| 8,324,525 B2 | 12/2012 | Shannon et al. |
| 8,337,661 B2 | 12/2012 | Shannon et al. |
| 8,357,264 B2 | 1/2013 | Shannon et al. |
| 8,404,598 B2 | 3/2013 | Liao et al. |
| 8,658,541 B2 | 2/2014 | Lee et al. |
| 8,808,561 B2 | 8/2014 | Kanarik et al. |
| 8,883,028 B2 | 11/2014 | Kanarik |
| 8,962,488 B2 | 2/2015 | Liao et al. |
| 8,974,684 B2 | 3/2015 | Banna et al. |
| 9,053,908 B2 | 6/2015 | Sriraman et al. |
| 9,171,699 B2 | 10/2015 | Valcore, Jr. et al. |
| 9,197,196 B2 | 11/2015 | Valcore, Jr. et al. |
| 9,243,320 B2 | 1/2016 | Nashiki et al. |
| 9,318,304 B2 | 4/2016 | Leray et al. |
| 9,536,749 B2 | 1/2017 | Marakhtanov et al. |
| 2002/0160125 A1* | 10/2002 | Johnson ............ H01J 37/32082 427/569 |
| 2009/0284156 A1 | 11/2009 | Banna et al. |
| 2009/0295296 A1 | 12/2009 | Shannon et al. |
| 2011/0309049 A1 | 12/2011 | Papasouliotis et al. |
| 2013/0214682 A1 | 8/2013 | Valcore, Jr. et al. |
| 2014/0009073 A1 | 1/2014 | Valcore, Jr. et al. |
| 2014/0265852 A1 | 9/2014 | Valcore, Jr. |
| 2014/0305589 A1 | 10/2014 | Valcore, Jr. |
| 2014/0367043 A1 | 12/2014 | Bishara et al. |
| 2015/0002018 A1 | 1/2015 | Lill et al. |
| 2015/0020971 A1 | 1/2015 | Kanarik |
| 2015/0047840 A1 | 2/2015 | Hurtado |
| 2015/0072530 A1 | 3/2015 | Kim et al. |
| 2015/0130354 A1 | 5/2015 | Leray et al. |

\* cited by examiner

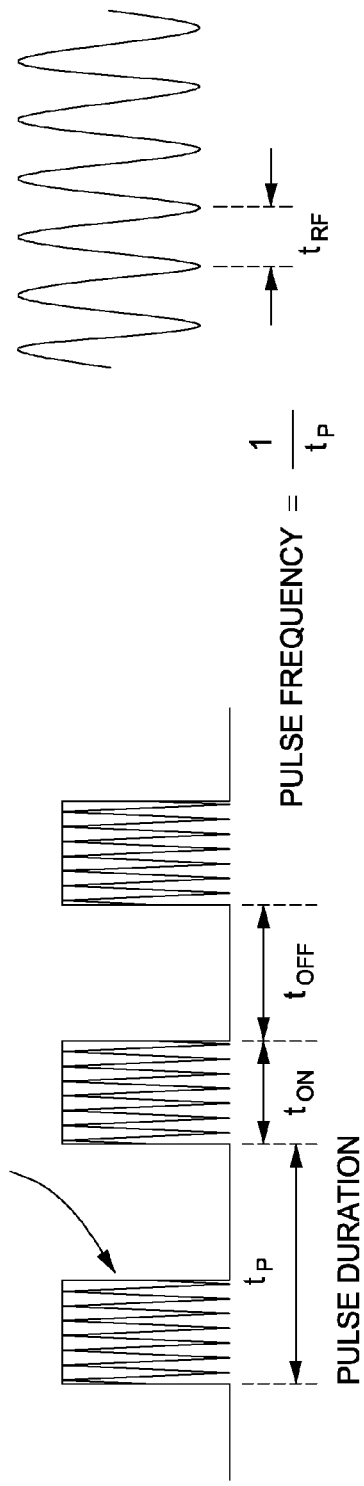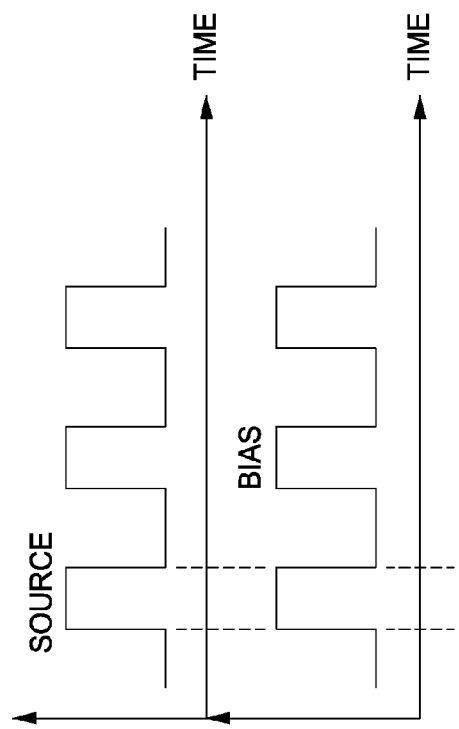
FIG. 2A
FIG. 2B
FIG. 2C

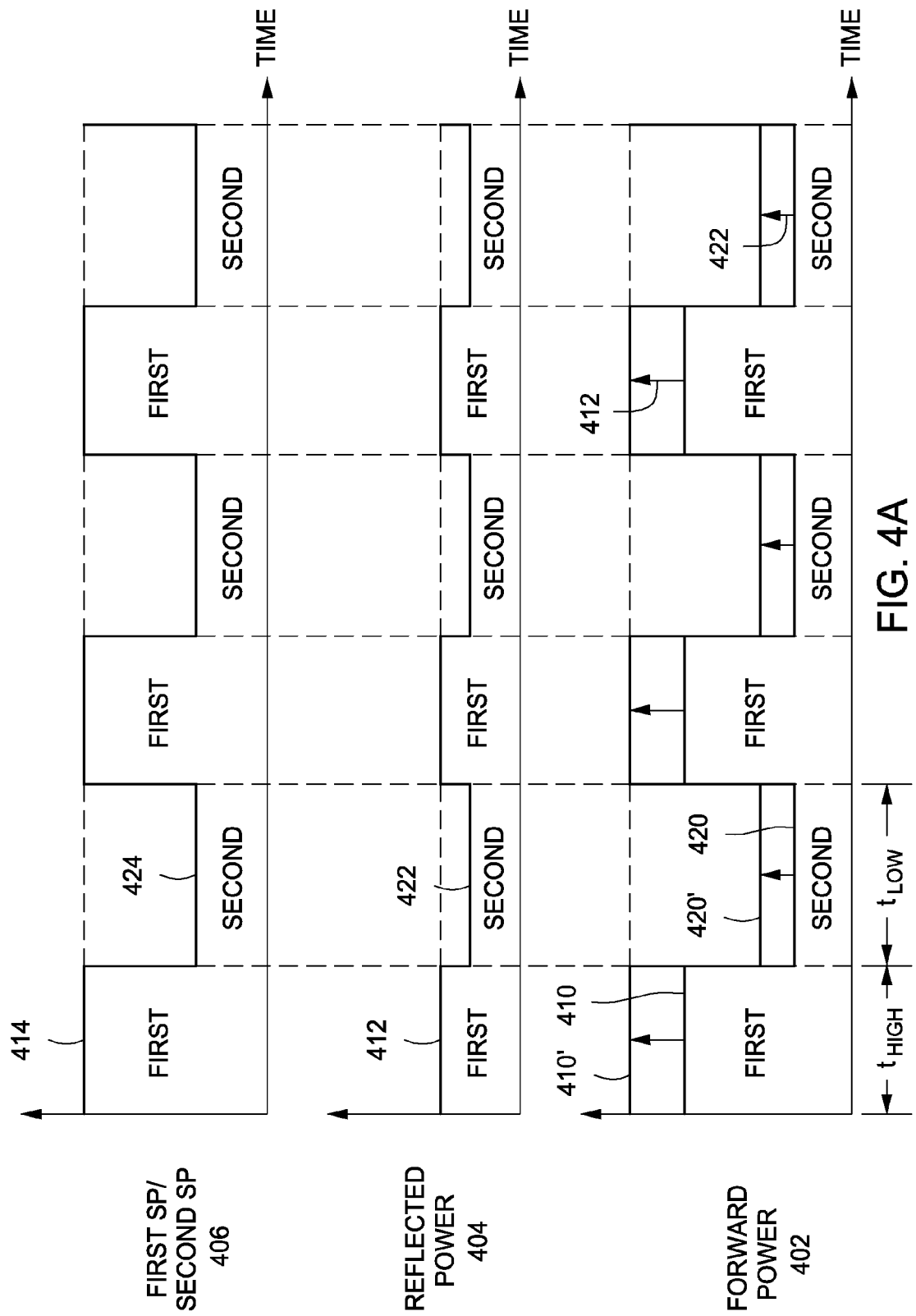

RF POWER DELIVERY REGULATION FOR PROCESSING SUBSTRATES

CROSS-REFERENCE TO RELATED APPLICATIONS

This application claims benefit of U.S. provisional patent application Ser. No. 62/237,367, filed Oct. 5, 2015, which is herein incorporated by reference.

FIELD

Embodiments of the present disclosure generally relate to RF power delivery methods used for processing a substrate.

BACKGROUND

In conventional radio frequency (RF) plasma processing, such as that used during stages of fabrication of many semiconductor devices; RF energy, which may be generated in continuous or pulsed wave modes, may be provided to a substrate process chamber via multiple RF energy sources. Due to mismatches between the impedance of the RF energy source and the plasma formed in the process chamber, RF energy is reflected back to the RF energy sources, resulting in inefficient use of the RF energy and wasting energy, potential damage to the process chamber or RF energy sources, and potential inconsistency/non-repeatability issues with respect to substrate processing.

In process chambers that use dual-level pulsing, load leveling can be performed to compensate for the reflected power such that the forward power provided by the RF energy sources is increased to compensate for the measured/estimated reflected power in order to produce the desired delivered power (i.e., delivered power=forward power−reflected power).

However, in semiconductor process chambers with two or more RF energy sources that produce at least one continuous wave and at least one pulsed wave, the delivered power is not consistent. Specifically, the continuous wave power is affected by pulsing of other energy source due to impedance change between "on" period and "off" period of pulsing.

Accordingly, the inventors have provided improved methods and apparatus for RF power delivery to provide more consistent delivered power in systems that use both at least one continuous wave and at least one pulsed wave.

SUMMARY

Methods of operating a plasma enhanced substrate processing system using pulsed radio frequency (RF) power are provided herein. In some embodiments, a method of operating a plasma enhanced substrate processing system using pulsed radio frequency (RF) power includes providing a first pulsed RF power waveform to a process chamber at a first power level during a first time period, providing a second pulsed RF power waveform at a first power level to the process chamber during the first time period, obtaining a first reflected power created by the first and second pulsed RF power waveforms provided during the first time period, and performing a first load leveling process to adjust the first power level of the first pulsed RF power waveform to compensate for the obtained reflected power during the first time period to produce a delivered power at a preset power level.

In some embodiments, a non-transitory computer readable medium having instructions stored thereon that, when executed, cause a method of operating a plasma enhanced substrate processing system using pulsed radio frequency (RF) power to be performed. The method performed may include providing a first pulsed RF power waveform to a process chamber at a first power level during a first time period, providing a second pulsed RF power waveform at a first power level to the process chamber during the first time period, obtaining a first reflected power created by the first and second pulsed RF power waveforms provided during the first time period; and performing a first load leveling process to adjust the first power level of the first pulsed RF power waveform to compensate for the obtained reflected power during the first time period to produce a delivered power at a preset power level.

In some embodiments, a plasma enhanced substrate processing system may include a first RF generator configured to provide a first pulsed RF power waveform to a process chamber at a first power level during a first time period, and provide the first pulsed RF power waveform at a second power level during a second time period, and a second RF generator configured to provide a second pulsed RF power waveform at a first power level to the process chamber during the first time period, and a second pulsed RF power waveform at a second power level during the second time period, wherein the first RF generator is further configured to detect reflected power in the substrate processing system at each of the first and second time periods separately, and performs load leveling processes to adjust the first and second power levels of the first pulsed RF power waveform to compensate for the detected reflected power to produce a delivered power at a preset power level.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIG. 2A-C depicts pulsed waveforms of radio frequency signals in accordance with some embodiments of the present disclosure.

FIG. 4A-B depicts load leveling processes used with dual mode pulsing and continuous wave power in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide improved methods and apparatus for RF power delivery. Specifically, embodiments of the present disclosure provide more consistent delivered power in systems that use both at least one continuous wave or simulated continuous wave, and at least one pulsed wave. In some embodiments, RF generators that provide dual-level pulsing are used to simulate a continuous wave. Using the dual level pulsing, the high and low set powers can be advantageously set with suitable pulse frequency and duty cycle to compensate for the reflected power in the system while delivering a consistent delivered power. More specifically, load leveling mode can be set for both the high period and low period of the dual-level pulse, and set power can be compensated for each period. As a result, even if reflected power exists, total delivered power can be equivalent to set power. Further, when the set high set power is equal to the low set power, the delivered power can be continuous and steady between high period and low period. In some embodiments, the dual-level pulsing produced by the generator providing the simulated continuous wave may be synchronized with other RF source's pulsing. Embodiments of the present disclosure advantageously provide consistent power regulation and improved productivity, and better chamber to chamber matching.

Figure 1:
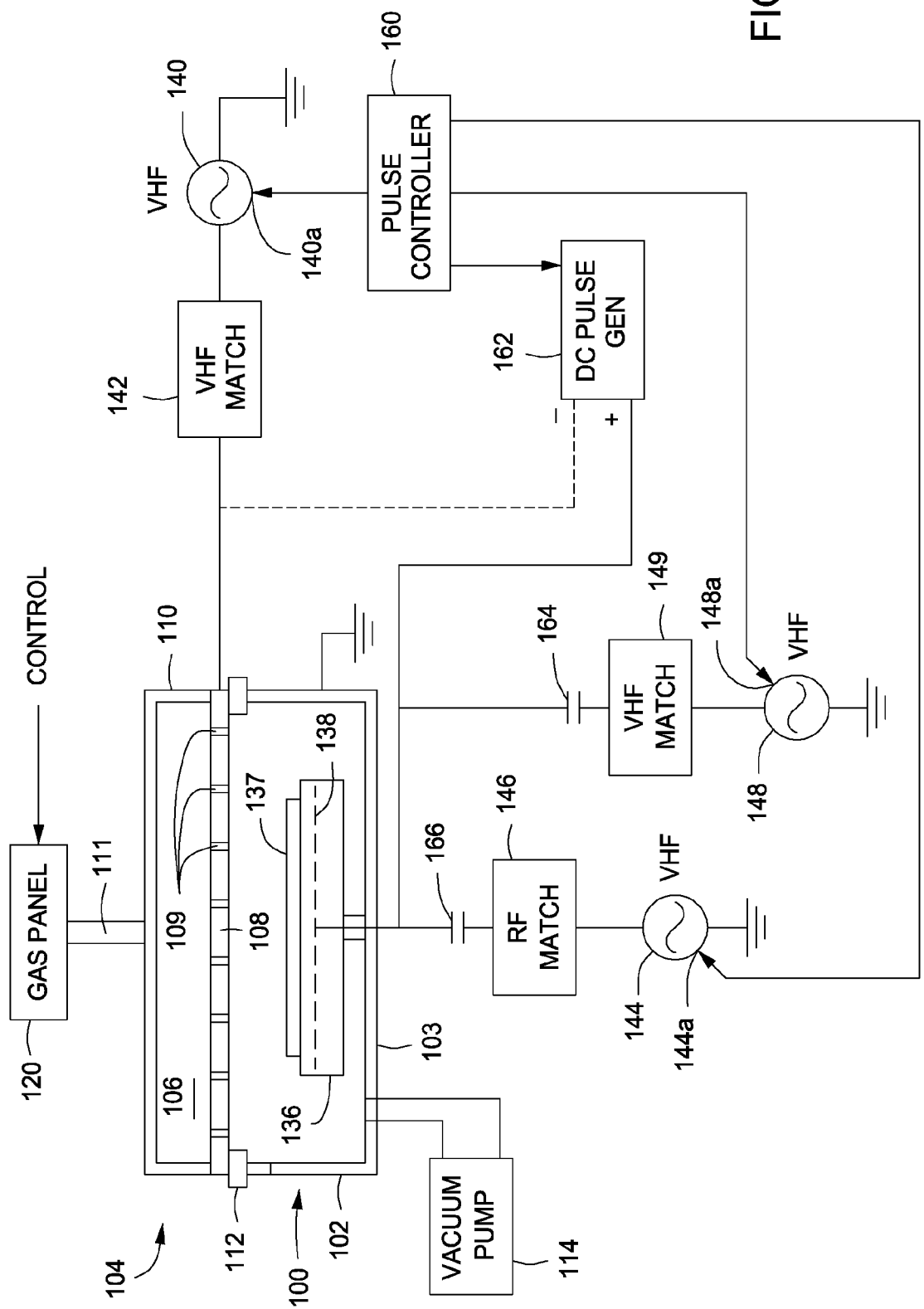
FIG. 1 depicts a plasma reactor in accordance with some embodiments of the present disclosure.

FIG. 1 depicts a plasma reactor which may be utilized to perform the inventive methods disclosed herein. The inventive methods may be performed in a capacitively coupled plasma reactor (e.g., as illustrated in FIG. 1) or any other suitable plasma reactor, such as an inductive coupled plasma reactor. However, the inventors have observed that the inventive methods can be particularly beneficial in capacitively coupled plasma reactors, such as where high bias power (e.g., about 2000 W or more) and low source power (e.g., about 500 W or less) is used, as undesired charging effects can be much more severe than, for example, in inductively coupled plasma processing chambers. In some embodiments, the inventors have discovered that the present inventive methods provide particular benefit in configurations where at least one of a DC bias ($V_{DC}$), a $V_{RF}$, or a plasma sheath voltage are at or above about 1000V.

The reactor of FIG. 1 includes a reactor chamber 100 enclosed by a cylindrical side wall 102, a floor 103 and a ceiling 104. The ceiling 104 may be a gas distribution showerhead including a gas manifold 106 overlying a gas distribution plate 108 having orifices 109 formed through the gas distribution plate 108. The gas manifold 106 is enclosed by a manifold enclosure 110 having a gas supply inlet 111. The gas distribution showerhead (i.e., ceiling 104) is electrically insulated from the cylindrical side wall 102 by an insulating ring 112. A vacuum pump 114, such a turbomolecular pump, evacuates the chamber 100. A gas panel 120 controls the individual flow rates of different process gases to the gas supply inlet 111. A workpiece support pedestal 136 supported through the floor 103 of the chamber may have an insulating top surface and an internal electrode (wafer support electrode 138). The internal electrode may, for example, be used for chucking a substrate 137 on the top surface of the support pedestal 136. Plasma source power is applied to the ceiling 104 (also referred to herein as a gas distribution showerhead) from a generator 140 through an impedance matching network 142. The ceiling or gas distribution showerhead is formed of a conductive material, such as aluminum for example, and therefore serves as a ceiling electrode. The generator 140 may generate VHF power in the high portion of the VHF spectrum, such as in a range of 100 to 200 MHz. The generator 140 has the capability of pulsing the VHF power generated at a desired pulse rate and duty cycle. For this purpose, the VHF source generator 140 has a pulse control input 140a for receiving a control signal or signals defining the pulse rate and/or duty cycle as well as the phase of each pulse produced by the RF generator 140.

Plasma bias power is applied to the wafer support electrode 138 from an RF bias generator 144 through an RF impedance matching network 146, and RF bias generator 148 through an RF impedance matching network 149. The RF bias generators 144, 148 may generate HF or LF power in the low portion of the HF spectrum or in the MF or LF spectrum, such as in a range of 13.56 MHz or a on the order of 1-2 MHz. The RF bias generators 144, 148 have the capability of pulsing the RF bias power generated at a desired pulse rate and duty cycle. For this purpose, the RF bias generators 144, 148 have pulse control inputs 144a, 148a for receiving a control signal or signals defining the pulse rate and/or duty cycle as well as the phase of each pulse produced by the RF generators 144,148. The RF bias generators 144, 148 may be independently pulsed, phased, and/or duty cycle controlled. Further, the RF bias generators 144, 148 may be pulsed synchronously or asynchronously.

Optionally, plasma source power may be applied to the wafer support electrode 138 from a second VHF generator through a VHF impedance match (not shown). The second VHF generator may generate VHF power in the low portion of the VHF spectrum, such as in a range of 50 to 100 MHz. The second VHF generator has the capability of pulsing the VHF power generated at a desired pulse rate and duty cycle. For this purpose, the second VHF generator has a pulse control input for receiving a control signal or signals defining the pulse rate and/or duty cycle as well as the phase of each pulse produced by the second VHF generator. For example, in some embodiments, one of the RF bias generators 144, 148 and its components (e.g., match, pulse control inputs, etc.) can be replaced with the second VHF generator and its components. Alternatively, the second VHF generator and its components may be included in addition to the first RF generator 140, and the bias generators 144, 148 and their respective components.

In some embodiments, the matching networks 142, 146, and 149 may be formed by one or more capacitors and/or an inductor. The values of capacitor may be electronically or mechanically tuned to adjust the matching of each of the matching networks 142, 146, and 149. In lower power systems, the one or more capacitors may be electronically tuned rather than mechanically tuned. In some embodiments, the matching networks 142, 146, and 149 may have a tunable inductor. In some embodiments, one or more of the capacitors used in the matching networks 142, 146, and 149 may be one or more fixed capacitors or series capacitors. In other embodiments, one or more of the capacitors used in the matching networks 142, 146, and 149 may be a variable capacitor, which may be electronically or mechanically tuned to adjust the matching of the matching networks 142, 146, and 149. In some embodiments, one or more of the matching networks 142, 146, and 149 may have a capacitive shunt to ground. The above described matching networks are illustrative only and other various configurations of matching networks having one or more adjustable elements for tuning the matching network may be utilized and tuned in accordance with the teachings provided herein.

A pulse controller 160 is programmable to apply pulse control signals to each of the pulse control inputs 140a, 144a, 148a of the generators 140, 144, 148, to produce the desired phase lead or lag relationship and/or duty cycle relationship among the pulses of the generator 140 (e.g., VHF source power generator) and the RF bias power generators 144, 148. Although shown as a separate component in FIG. 1, in some embodiments, the pulse controller 160 can be disposed internally inside of each RF generator. Synchronization signals would be generated at a master generator (e.g., generator 140), and sent to other slave generators (e.g., generators 144 and/or 148).

In some embodiments, the RF generators 140, 144 and 148, the match networks 142, 146, and 149, and/or the pulse controller 160 comprise a central processing unit (CPU), a plurality of support circuits, and a memory. While the present exemplary embodiments of the RF generators 140, 144 and 148, the match networks 142, 146, and 149 and pulse controller 160 are discussed with respect to a computer having a CPU, support circuits, and a memory, one of ordinary skill in the art would recognize that RF generators 140, 144 and 148, the match networks 142, 146, and 149, and pulse controller 160 could be implemented in a variety of ways, including as an application specific interface circuit (ASIC), a field-programmable gate array (FPGA), a system-on-a-chip (SOC), and the like. Various embodiments of the pulse controller 160 may also be integrated within other process tool controllers, with corresponding input/output interfaces as known in the art.

The support circuits may include a display device as well as other circuits to support the functionality of the CPU. Such circuits may include clock circuits, cache, power supplies, network cards, video circuits and the like The memory may comprise read only memory, random access memory, removable memory, disk drives, optical drives, and/or other forms of digital storage. The memory is configured to store an operating system and a sub-fab control module. The operating system executes to control the general operation of the RF generators 140, 144 and 148, the match networks 142, 146, and 149, and pulse controller 160, including facilitating the execution of various processes, applications, and modules to control the one or more generators 140, 144 and 148 or the match networks 142, 146, and 149 in order to perform the methods discussed here (e.g., method 600 discussed below).

Further, a DC generator 162 may be coupled to either (or both) the wafer support electrode 138 and the ceiling 104. In some embodiments, DC generator 162 may supply continuous and/or variable DC. In some embodiments, DC generator 162 may provide pulsed DC power. The pulse repetition rate, phase and duty cycle of the DC generator are controlled by the pulsed controller 160. A DC isolation capacitor 164, 166 may be provided to isolate each RF generator from the DC generator 162. A DC signal generated by the DC generator may be synchronized with the RF signals generated by the generators 140, 144, and 148 to provide benefits such as reduced charge-up on a substrate 137 or improved etch rate control of the substrate using a plasma formed in the plasma reactor.

FIG. 2A depicts a time domain waveform diagram that may reflect the pulsed RF output of each of the generators 140, 144, 148, showing the pulse envelope of the pulsed RF output, characterized by the following parameters controlled by the pulse controller 160 individually for each generator 140, 144, 148: a pulse duration $t_P$, a pulse "on" time $t_{ON}$, a pulse "off" time $t_{OFF}$, a pulse frequency $1/t_P$, and a pulse duty cycle $(t_{ON}/t_P) \cdot 100$ percent. The pulse duration $t_P$ is the sum of $t_{ON}$ and $t_{OFF}$.

FIGS. 2B and 2C depict contemporaneous time domain waveforms of two RF pulsed signals synchronized together in such a manner that they have identical phase and duty cycle and therefore a phase difference of zero between them. The exemplary embodiment depicted in FIGS. 2B and 2C is one exemplary form of synchronization between a first pulsed RF signal (e.g., a pulsed source signal) and a second pulsed RF signal (e.g., a pulsed bias signal). In this exemplary embodiment, both the phase and duty cycle of each pulsed signal is the same.

Figure 3B:
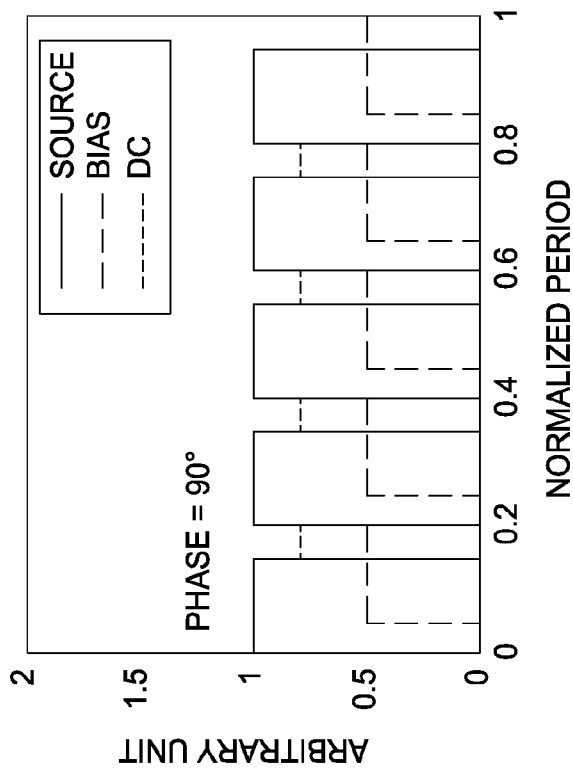
FIG. 3A-D depicts phase variance between pulsed waveforms in accordance with some embodiments of the present disclosure.
Figure 3A:
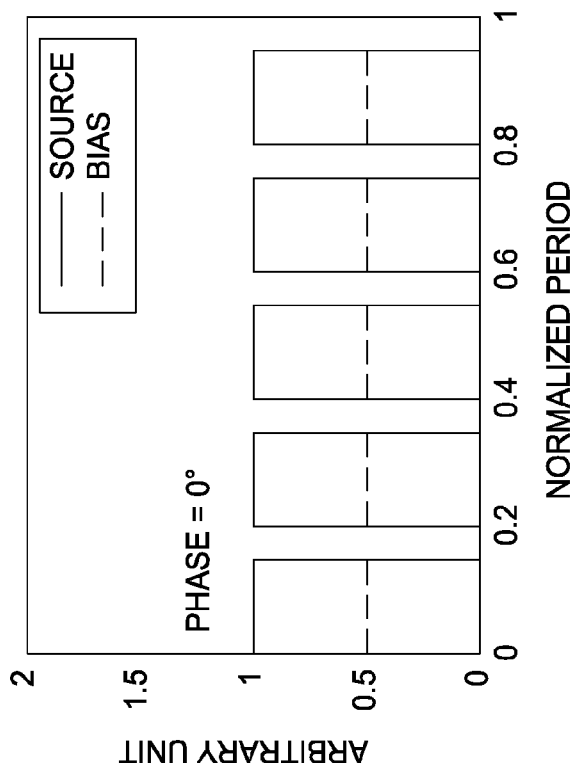
Figure 3C:
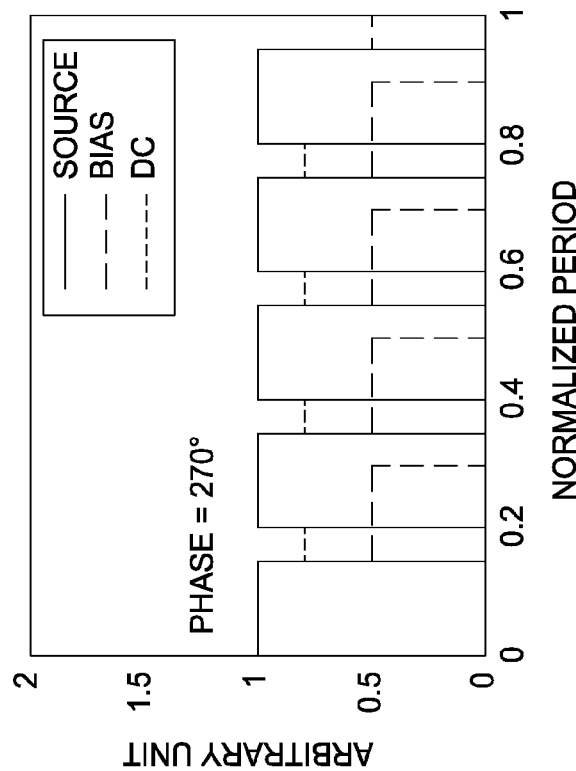
Figure 3D:
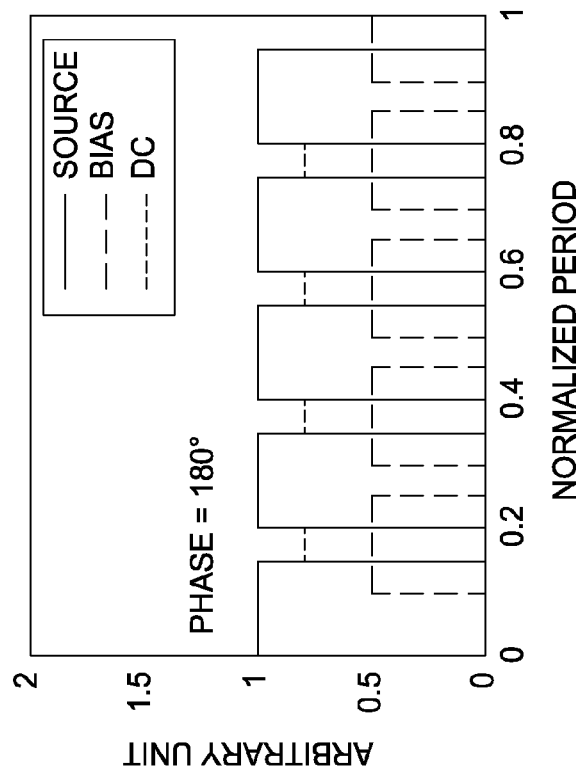

In some embodiments of the present disclosure, the pulsed signals provided by the generators 140, 144, and 148 are varied in phase. FIGS. 3A through 3D illustrate how the phase difference may be varied by the pulse controller 160, and depict the superposition of the source and bias power waveforms at phase differences of 0°, 90°, 180° and 270°, respectively, where the phase difference is defined by how much the second pulse output lags the first pulse output. FIG. 3A corresponds to the example of zero phase difference of FIG. 2B. FIG. 3B depicts a case in which the bias power pulse output lags the source power pulse output by 90°. FIG. 3C depicts a case in which the bias power pulse output lags the source power pulse output by 180 degrees. FIG. 3D depicts a case in which the bias power pulse output lags the source power pulse output by 270°. Although FIGS. 3A-3B only depict two pulsed RF signals with varying phase, in embodiments consistent with the present disclosure can also include three or more pulsed RF signals with varying phases.

In some embodiments, etching rates may be enhanced while pulsing the plasma by controlling the phase lead or lag of the RF envelopes. When the source and bias are pulsed independently out-of-phase, or with varying duty cycle, the different plasma dynamics of the very high frequency (VHF) and low frequency (LF) allow for better plasma fill over the entire pulse. In some embodiments, a combination of VHF of about 162 MHz source frequency is used in conjunction with a bias frequency of about 13.56 MHz and another bias frequency of about 2 MHz. In some embodiments, a combination of VHF of about 162 MHz source frequency is used in conjunction with a bias frequency of about 60 MHz and another bias frequency of about 2 MHz. In some embodiments, a source frequency of about 60 MHz is used in combination with bias frequencies of about 2 MHz and/or about 13.56 MHz.

FIG. 4A depicts a load leveling compensation method used with dual mode pulsing. In FIG. 4A, a single dual-level RF pulse delivered power 406 is shown that may be delivered by any one of generators 140, 144 or 148. In some embodiments, the delivered power 406 that may be delivered by more than one of generators 140, 144 or 148. The delivered power 406 has a first power pulse at a first power level 414 and a second power pulse at a second power level 424 that are delivered during two corresponding RF power periods $t_{HIGH}$, and $t_{LOW}$. In some embodiments, the frequency of the first RF source signal may be about 2 Mhz to about 162 MHz. In some embodiments, the first power level of the first pulse duration may be about 200 watts to about 5.0 KW (e.g., 3.6 KW), the value of the second power level may be about 0-100% of the first power level. In other embodiments, the second power level may be greater than the first power level. To achieve desired high and low power levels for the delivered power 406, power level a first set point may be set at the first power level 414, and a second set point may be set at the second power level 424.

FIG. 4A further depicts a dual-level RF pulse forward power 402 that may be delivered by any one of generators 140, 144 or 148 to produce the desired delivered power 406, in addition to a measured/estimated reflected power 404. Since the delivered power 406=forward power 402−reflected power 404, the forward power is adjusted to compensate for the reflected power in order to provide the desired delivered power. For example, say the first set point for the delivered power 406 is 500 watts during $t_{HIGH}$. As the one or more of generators 140, 144 or 148 start providing a forward power 402 at a first power level 410 during $t_{HIGH}$, the first power level 412 of the reflected power 404 is measured. In the above example, the one or more of generators 140, 144 or 148 may provide a forward power at 500 watts (i.e., 410), which produces a reflected power of 20 watts (i.e., 412), for example. A load leveling process would compensate for the lost reflected power 404 the first power level 412 by increasing the first power level 410' to provide 520 watts (500 watts+20 watts).

Similarly, second set point for the delivered power 406 may be set to 100 watts during $t_{LOW}$. As the one or more of generators 140, 144 or 148 start providing a forward power 402 at a second power level 420 during $t_{LOW}$, the second power level 422 of the reflected power 404 is measured. In the above example, the one or more of generators 140, 144 or 148 may provide a forward power at 100 watts (i.e., 420), which produces a reflected power of 10 watts (i.e., 422), for example. A load leveling process would compensate for the lost reflected power 404 at the second power level 422 by increasing the first power level 420' to provide 110 watts (100 watts+10 watts).

Figure 4B:
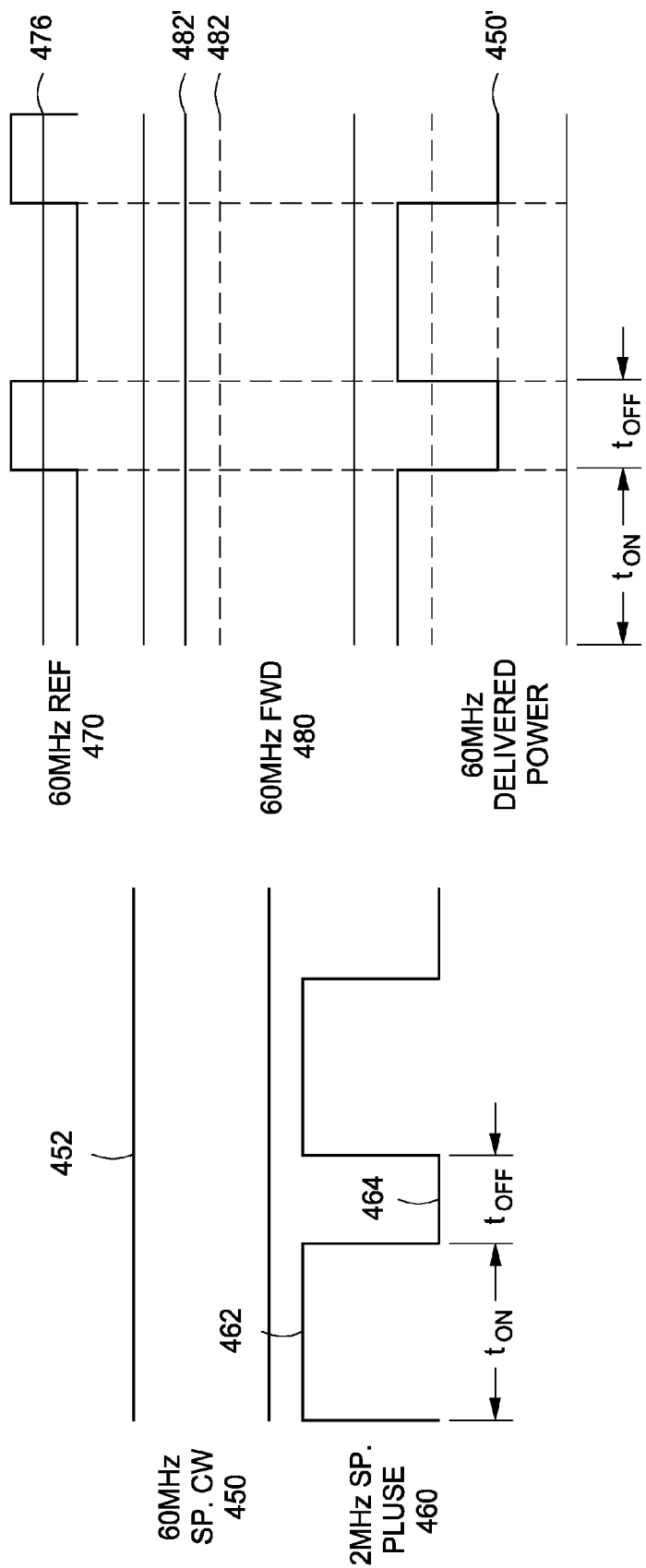

However, the above load leveling compensation process used for dual-level pulsing shown in FIG. 4A may not be adequate for substrate processes that use continuous wave power, or simulated continuous wave power, in conjunction with dual-level pulsing power as shown in FIG. 4B. Specifically, as noted above, in semiconductor process chambers with two or more RF energy sources that produce at least one continuous wave and at least one pulsed wave, the delivered power is not consistent. This because the continuous wave power is affected by pulsing of other energy source due to impedance change between "on" period and "off" period of pulsing as shown in FIG. 4B.

In FIG. 4B, a desired delivered power 450 is shown as a continuous wave (CW) in conjunction with a bias pulse wave power 460. The CW delivered power 450 may be a source wave having a frequency about 2 Mhz to about 162 MHz provided by any one of generators 140, 144 or 148. In some embodiments, power level 452 of the CW delivered power 450 may be about 200 watts to about 5.0 KW (e.g., 3.6 KW). The bias pulse wave power 460 may be a single square pulse having a first power level 462 during $t_{on}$ and a second power level 464 during $t_{off}$. In some embodiments, the pulse wave power 460 may be a dual-level pulse having a second power level 464 at a zero power (e.g., an off power mode). In some embodiments, the pulse wave power 460 may be a dual-level pulse having a second power level 464 about 1-100% of the first power level. In some embodiments, the frequency of the pulse wave power 460 may be about 2 Mhz to about 162 MHz. The pulse wave power 460 may be a bias power provided by any one of generators 140, 144 or 148.

As shown in FIG. 4B, the CW forward power 480 and the pulse wave power 460 will produce a reflected power 470. In systems that employ continuous wave power, the reflected power is usually an average measured value 476. A load leveling process would compensate for the lost average reflected power 476 by increasing the power level 482 of the CW forward power 480 to a new power level 482' (i.e., power level 482+average reflected power 476) to attempt to meet the desired delivered power set points. However, as the pulse wave power 460 is cycled on and off, the reflected power of the system changes and, thus, so does the delivered power 450'. The inconsistency of the delivered power 450' may produce undesirable results and in not consistent with the desired delivered power 450.

Figure 5:
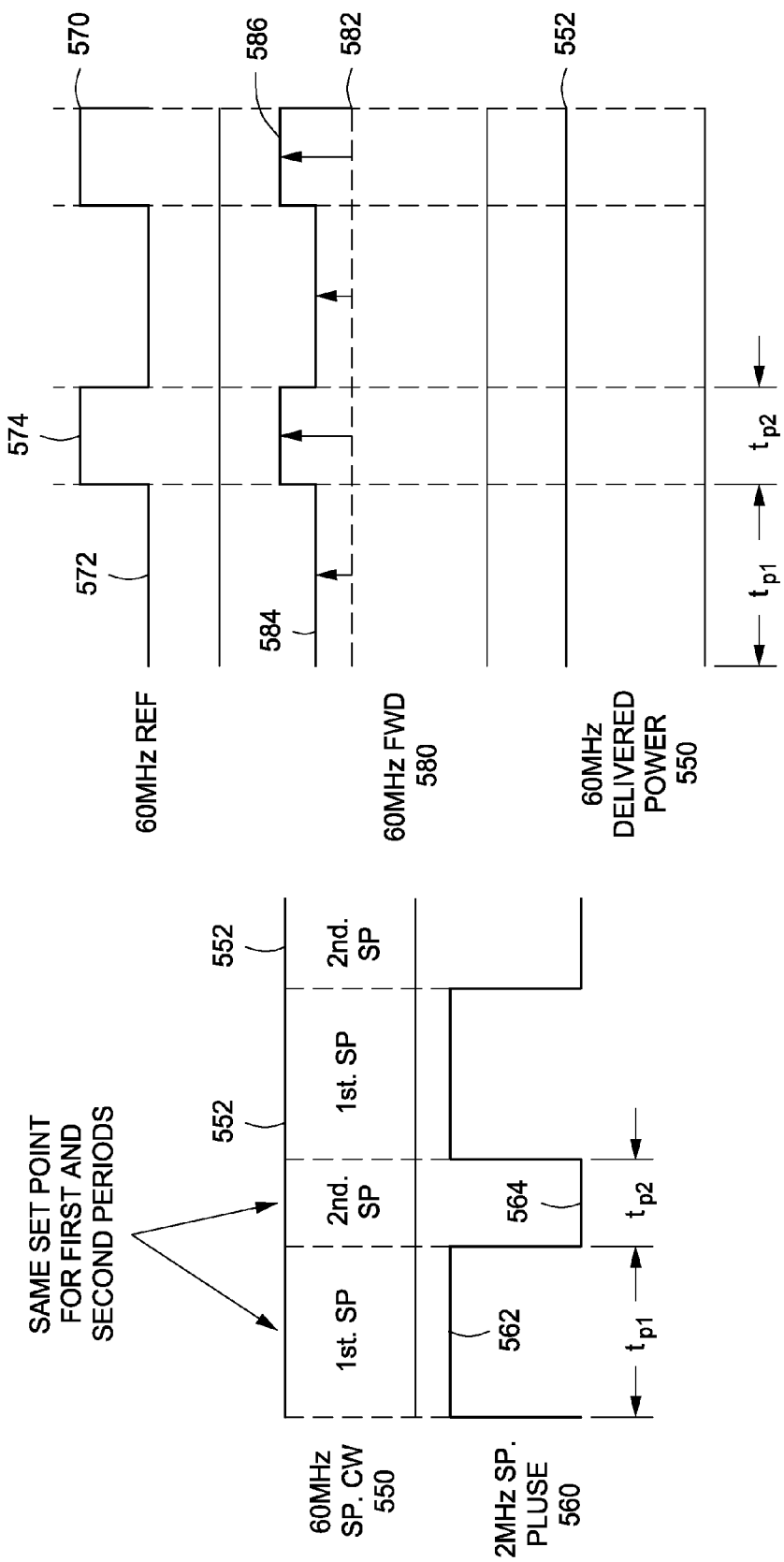
FIG. 5 depicts load leveling processes used with simulated continuous wave power in conjunction with bias pulse power in accordance with some embodiments of the present disclosure.

In view of the foregoing, embodiments consistent with the present disclosure disclose a method for providing more consistent delivered power in systems that use both at least one continuous wave (or simulated continuous wave) and at least one pulsed wave. In some embodiments, RF generators that provide dual-level pulsing are used to simulate a continuous wave. As shown in FIG. 5, using the dual level pulsing, the high and low set powers can be advantageously set with suitable pulse frequency and duty cycle to compensate for the reflected power in the system while delivering a consistent delivered power. More specifically, load leveling mode can be set for both the high period and low period of the dual-level pulse, and set power can be compensated for each period. As a result, even if reflected power exists, total delivered power can be equivalent to set power. Further, when the set high set power is equal to the low set power, the delivered power can be continuous and steady between high period and low period. In some embodiments, the dual-level pulsing produced by the generator providing the simulated continuous wave may be synchronized with other RF source's pulsing. Embodiments of the present disclosure advantageously provide consistent power regulation and improved productivity, and better chamber to chamber matching.

Specifically, as shown in FIG. 5, set points for a desired delivered power 550 in the form of a first pulse wave are provided. The first and second set points shown have equivalent power levels 552 during time periods $t_{p1}$ and $t_{p2}$. That is, the first set point for the first power level and the second set point for the second power level are substantially the same. By setting the first set point for the first power level and the second set point for the second power level to be the same, continuous wave power may be simulated. In some embodiments, power level 552 of the first pulse wave for the delivered power 550 may be about 200 watts to about 5.0 KW (e.g., 3.6 KW). Similar to FIG. 4B, a bias pulse wave power 560 in FIG. 5 may be a single square pulse having a first power level 562 during $t_{p1}$ and a second power level 564 during $t_{p2}$. In some embodiments, the pulse wave power 560 may be a dual-level pulse having a second power level 564 at a zero power (e.g., an off power mode). In some embodiments, the pulse wave power 560 may be a dual-level pulse having a second power level 564 about 1-99% of the first power level. In some embodiments, the frequency of the pulse wave power 560 may be about 2 Mhz to about 162 MHz. The pulse wave power 560 may be a bias power provided by any one of generators 140, 144 or 148.

Since the first pulse wave to be provided is not an actual continuous wave, an average reflected value across multiple time periods is not obtained and applied to the forward power provided as discussed above with respect to FIG. 4B. Rather, a reflected power 570 may be obtained (i.e., measured, estimated, or calculated) for each time period (e.g., $t_{p1}$, $t_{p2}$, $t_{pn}$, etc.) and compensated for accordingly. For example, in FIG. 5, the obtained reflected power 570 may be used to adjust the power levels 582 of the forward power 580 provided to compensate for the lost reflected power to produce a constant delivered power 550.

For example, in the exemplary embodiment shown in FIG. 5, the first set point for the delivered power 550 may be set to 500 watts during $t_{p1}$ and 500 watts during $t_{p2}$. One or more of generators 140, 144 or 148 will provide a forward power 580 (i.e., a first pulsed RF power waveform) at a first power level 582 during $t_{p1}$. In addition, one or more of generators 140, 144 or 148 will provide the bias pulse wave power 560 (i.e., a second pulsed RF power waveform) at a first power level 562 during $t_{p1}$. The first power level 572 of the reflected power 570 is obtained/measured as the first and second pulsed RF power waveforms are provided. In the above example, the one or more of generators 140, 144 or 148 may provide a forward power at 500 watts (i.e., 582), which produces a reflected power of 20 watts (i.e., 572), for example. A first load leveling process would compensate for the lost reflected power 572 by increasing the first power level 584 to provide 520 watts (500 watts+20 watts) during $t_{p1}$. In some embodiments, the reflected power 570 may be measured by a sensor disposed in the one or more of generators 140, 144 or 148. In some embodiments, the first load leveling process may be performed by the one or more of generators 140, 144 or 148.

Similarly, the second set point for the delivered power 552 may be set to 500 watts during $t_{p2}$. As the one or more of generators 140, 144 or 148 start providing a forward power 580 at a power level 582 during $t_{p2}$ (i.e., a second pulsed RF power waveform), the second power level 574 of the reflected power 570 is measured. The second power level 574 will be different than the first reflected power level 572 due to the duty cycle and reflected power provided by the pulse wave power 560. Thus, a second load leveling process would compensate for the lost reflected power 574 by increasing the second power level 586 by the measured reflected power 574. The delivered power 550 after load leveling would match the desired set point power levels 552 after performing the dual load leveling processes (i.e., the first and second load leveling processes).

Figure 6:
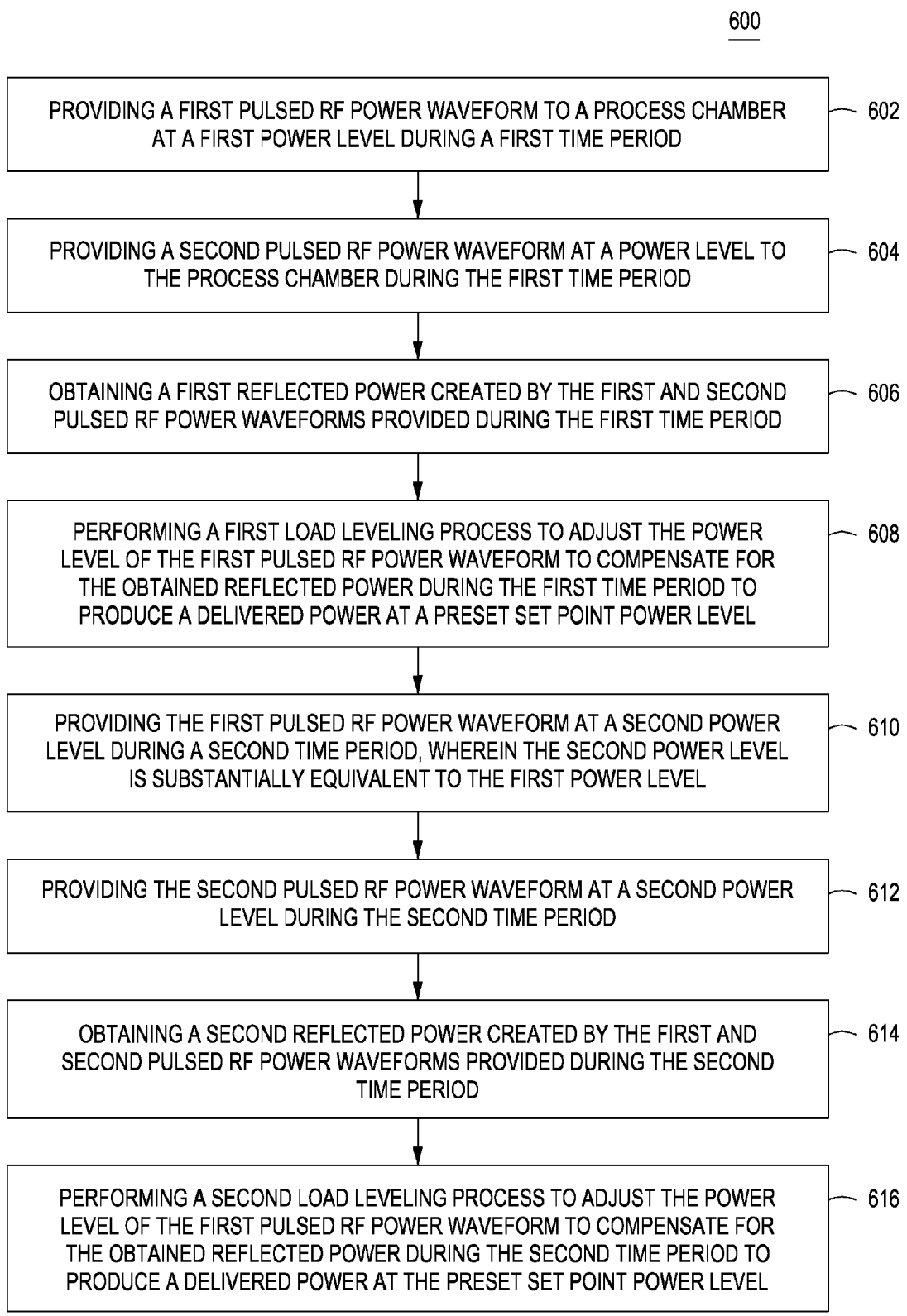
FIG. 6 depicts a flow chart of a method for providing a load leveling process for more consistent RF power delivery in accordance with some embodiments of the present disclosure.

FIG. 6 depicts a flow chart of a load leveling method 600 for providing more consistent RF power delivery in accordance with some embodiments of the present disclosure. The method 600 may be performed, for example, in the plasma reactor discussed above in FIG. 1. The method 600 begins at 602 by providing a first pulsed RF power waveform to a process chamber at a first power level during a first time period. In some embodiments, the first pulsed RF power waveform is an RF source signal, such as, for example, a forward power 580 provided by the generator 140. The first pulsed RF power waveform may be provided at a VHF frequency of between about 60 MHz to about 162 MHz. In some embodiments, the VHF frequency of the first RF source signal is about 162 MHz. In some embodiments, the VHF frequency of the first RF source signal is about 60 MHz. In some embodiments, the first power level of the first pulse duration may be about 200 watts to about 5.0 KW (e.g., 3.6 KW).

At 604, a second pulsed RF power waveform is provided at a first power level to the process chamber during the first time period. In some embodiments, the second pulsed RF power waveform is a bias RF power signal, such as, for example, a bias power provided by the generator 144 or 148. The second pulsed RF power waveform may be provided at a frequency of between about 2 MHz to about 162 MHz. In some embodiments, the frequency of the second pulsed RF power waveform is about 60 MHz. In some embodiments, the first power level of the first pulse duration of the second RF source signal may be about 200 watts to about 5.0 KW (e.g., 3.6 KW). In some embodiments, the second pulsed RF power waveform may be synchronized with the first pulsed RF power waveform.

At 606, a first reflected power created by the first and second pulsed RF power waveforms provided during the first time period is obtained. In some embodiments, the first reflected power may be obtained through measurement via one or more sensors communicatively coupled to the RF generators 140, 144 and 148, or by detection of the reflected power by one or more of the RF generators 140, 144 and 148. In some embodiments, the first reflected power may be obtained through an estimation or calculation based on the forward power being used.

At 608, a first load leveling process is performed to adjust the power level of the first pulsed RF power waveform to compensate for the obtained reflected power during the first time period to produce a delivered power at a preset set point power level. For example, as discussed above with respect to FIG. 5, a first load leveling process would compensate for the lost reflected power 572 by increasing the first power level 584 to provide 520 watts (500 watts+20 watts) during $t_{p1}$. In this example, the reflected power 572 is the reflected power produced by both the first and second pulsed RF power waveforms.

At 610, the first pulsed RF power waveform is provided at a second power level during a second time period, wherein the second power level is substantially equivalent to the first power level. This has the effect of producing a simulated continuous wave. At 612, a second pulsed RF power waveform is provided at a second power level during the second time period. At 614, a second reflected power created by the first and second pulsed RF power waveforms provided during the second time period is obtained. At 616, a second load leveling process is performed to adjust the power level of the first pulsed RF power waveform to compensate for the obtained reflected power during the second time period to produce a delivered power at the preset set point power level. For example, as discussed above with respect to FIG. 5, a second load leveling process would compensate for the lost reflected power 574 by increasing the first power level 586 by the amount of the lost reflected power 574. In this example, the reflected power 574 is the reflected power produced by both the first and second pulsed RF power waveforms during time $t_{p2}$.

While the foregoing is directed to embodiments of the present disclosure, other and further embodiments of the disclosure may be devised without departing from the basic scope thereof.

The invention claimed is:

1. A method of operating a plasma enhanced substrate processing system using pulsed radio frequency (RF) power, comprising:
   providing a first pulsed RF power waveform to a process chamber at a first power level during a first time period;
   providing a second pulsed RF power waveform at a first power level to the process chamber during the first time period;
   obtaining a first reflected power created by the first and second pulsed RF power waveforms provided during the first time period; and
   performing a first load leveling process to adjust the first power level of the first pulsed RF power waveform to compensate for the obtained first reflected power during the first time period to produce a delivered power at a preset power level.

2. The method of claim 1, further comprising:
providing the first pulsed RF power waveform at a second power level during a second time period, wherein the second power level is substantially equivalent to the first power level;
providing a second pulsed RF power waveform at a second power level during the second time period;
obtaining a second reflected power created by the first and second pulsed RF power waveforms provided during the second time period; and
performing a second load leveling process to adjust the first power level of the first pulsed RF power waveform to compensate for the obtained second reflected power during the first time period to produce a delivered power at the preset power level.

3. The method of claim 2, wherein the first pulsed RF power waveform is an RF source signal.

4. The method of claim 2, wherein the second pulsed RF power waveform is an RF bias signal.

5. The method of claim 2, wherein the second power level of the second pulsed RF power is a zero power level.

6. The method of claim 2, wherein the first and second load leveling processes performed adjust the first and second power levels, respectively, for the first pulsed RF power waveform to provide a substantially constant delivered power.

7. The method of claim 2, wherein the obtained first and second reflected powers are measured values.

8. The method of claim 2, wherein the obtained first and second reflected powers are calculated values based on the first and second pulsed RF power waveforms used, respectively.

9. The method of claim 2, wherein the first reflected power is created by the first and second pulsed RF power waveforms provided during the first time, and wherein the second reflected power is created by the first and second pulsed RF power waveforms provided during the second time period.

10. The method of claim 2, wherein a frequency of the first pulsed RF power waveform is about 2 MHz to about 162 MHz, and wherein a frequency of the second pulsed RF power waveform is about 2 MHz to about 162 MHz.

11. The method of claim 2, wherein the first and second power levels of the first pulsed RF power waveform is about 200 watts to about 5.0 KW.

12. The method of claim 2, wherein the first power level of the second pulsed RF power waveform is about 200 watts to about 5.0 KW, and wherein the second power level is about 0-99% of the first power level of the second pulsed RF power waveform.

13. The method of claim 2, wherein the first pulsed RF power waveform and the second pulsed RF power waveform are synchronized.

14. The method of claim 2, wherein the first and second time periods are different from each other.

15. The method of claim 1, wherein the first pulsed RF power waveform simulates a continuous RF power waveform provided to the process chamber at the first power level.

* * * * *